US012763128B2

(12) United States Patent
Waldrop et al.

(10) Patent No.: US 12,763,128 B2
(45) Date of Patent: Oct. 13, 2026

(54) APPARATUSES AND METHODS FOR A PER-DRAM ADDRESSABILITY SYNCHRONIZER CIRCUIT

(71) Applicant: MICRON TECHNOLOGY, INC., Boise, ID (US)

(72) Inventors: William C. Waldrop, Allen, TX (US); Liang Chen, Allen, TX (US); Shingo Mitsubori, Tokyo (JP); Ryo Fujimaki, Sagamihara (JP); Atsuko Momma, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 171 days.

(21) Appl. No.: 18/958,966

(22) Filed: Nov. 25, 2024

(65) Prior Publication Data

US 2025/0095713 A1 Mar. 20, 2025

Related U.S. Application Data

(62) Division of application No. 17/890,974, filed on Aug. 18, 2022, now Pat. No. 12,183,385.

(51) Int. Cl.
*G11C 11/4096* (2006.01)
*G11C 11/4076* (2006.01)

(52) U.S. Cl.
CPC ...... *G11C 11/4076* (2013.01); *G11C 11/4096* (2013.01)

(58) Field of Classification Search
CPC ................................................ G11C 11/4096
See application file for complete search history.

(56) References Cited

U.S. PATENT DOCUMENTS

| | | | | |
|---|---|---|---|---|
| 12,183,385 | B2 | 12/2024 | Waldrop et al. | |
| 2013/0346684 | A1 * | 12/2013 | Bains | G11C 11/4096 711/E12.001 |
| 2024/0062803 | A1 | 2/2024 | Waldrop et al. | |

OTHER PUBLICATIONS

U.S. Appl. No. 17/890,974, titled, "Apparatuses and Methods for a Per-DRAM Addressability Synchronizer Circuit," filed Aug. 18, 2022, pp. all pages of application as filed.

* cited by examiner

*Primary Examiner* — Jason Lappas
(74) *Attorney, Agent, or Firm* — Dorsey & Whitney LLP

(57) ABSTRACT

Apparatuses, systems, and methods for a per-DRAM addressability (PDA) synchronizer circuit. The PDA synchronizer circuit receives a write command signal which may be synchronous to a DQS clock as part of a first PDA mode or asynchronous as part of a second PDA mode. The PDA synchronizer circuit includes a delay path which provides a first PDA signal responsive to the write command signal and a synchronizer which provides a second PDA signal responsive to the write command signal. The PDA synchronizer circuit provides a synchronized write command signal responsive to whichever of the first PDA signal or the second PDA signal was provided first. When a PDA mode is disabled, the write command signal may be passed as the synchronized write command signal.

20 Claims, 7 Drawing Sheets

APPARATUSES AND METHODS FOR A PER-DRAM ADDRESSABILITY SYNCHRONIZER CIRCUIT

CROSS REFERENCE TO RELATED APPLICATION(S)

This application is a divisional of pending U.S. patent application Ser. No. 17/890,974 filed Aug. 18, 2022. The aforementioned application is incorporated herein by reference, in its entirety, for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). When accessed, the memory cell may be coupled to a digit line (or bit line), and a voltage on the digit line may change based on the information stored in the coupled memory cell.

During access operations, the memory may receive a command and activate input buffers or output buffers to receive or send data via input/output pads of the memory device. It may be important to ensure that the input or output buffers remain active while data is being sent or received, for example by ensuring that the input or output buffers stay active for at least a length of time after the command is received.

DETAILED DESCRIPTION

Figure 1:
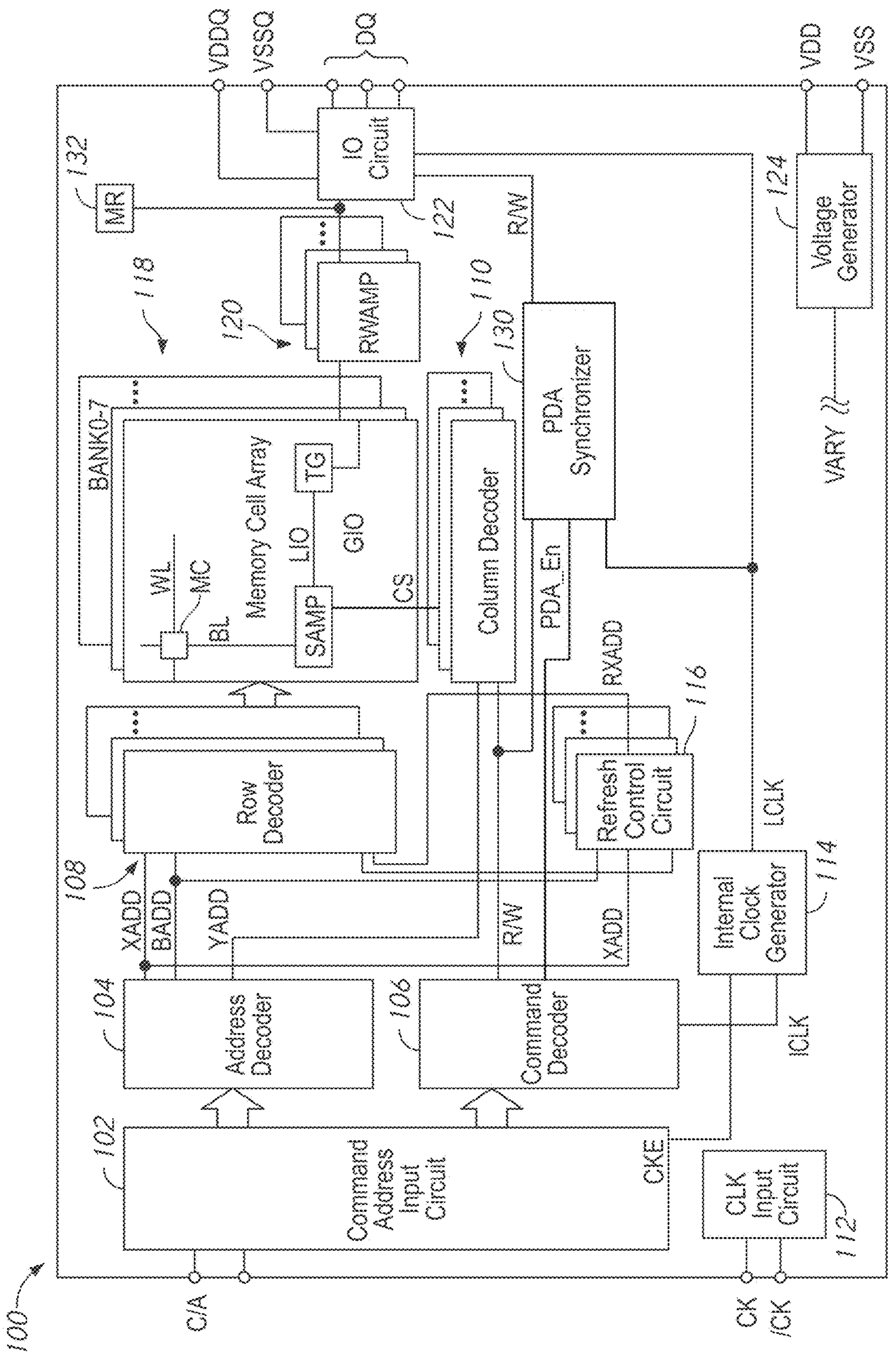
FIG. 1 is a block diagram of a semiconductor device according to some embodiments of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory arrays may generally include a number of memory cells arranged at the intersection of word lines (rows) and bit lines/digit lines (columns). During a read operation, the memory may receive a read command and row and column addresses which indicate which memory cell(s) data should be read from. The data is provided to output buffers, and read off from input/output (DQ) pads of the memory. During a write operation, the memory receives a write command and row and column addresses which indicate which memory cell(s) data should be written to. Responsive to the write command, the memory activates an input buffer, which allows data to be received from the DQ pads with timing based on a date strobe (DQS) clock.

The write path (e.g., the write buffers and other components) may also be used to load other information into the memory. For example, a per-DRAM addressability (PDA) operation may be used to broadcast commands to a specific DRAM in a memory module, and load information via the write path. For example, a PDA operation may be used to load settings into a mode register of the specified memory. Multiple PDA operational modes may be supported. For example, the memory may support a non-continuous or legacy mode, where the DQS signal does not begin toggling until a set time after the PDA command is received. The memory may also support a continuous mode, where DQS may remain toggling with no fixed timing to the PDA command. However, conflicts may occur between legacy mode logic which expects a write command signal, such as a write start signal (activated by the PDA command) to be synchronous with the DQS clock and continuous mode logic which does not require synchronization between the write command signal and the DQS clock. There may thus be a need for the memory to adapt to the PDA mode regardless of whether it is synchronous to the DQS clock or not.

The present disclosure is drawn to apparatuses, systems, and methods for a PDA synchronizer circuit. The PDA synchronizer circuit receives a write command signal and provides it in parallel (when a PDA mode is enabled) to a delay circuit and to a synchronizer. The synchronizer is synchronized to the DQS clock. A logic circuit provides a synchronized write command signal based on the signal from the delay circuit or the synchronizer, whichever arrives first. Accordingly, if the DQS strobe is toggling when the write command signal is received as part of a continuous mode PDA operation, then the write command signal will pass through the synchronizer and arrive at the logic before the signal passes through the delay circuit. If the DQS strobe begins toggling after the write command signal is received (e.g., with set timing as part of a legacy mode) then the write command signal may pass through the delay circuit first and the logic may make the delayed write command signal available as the synchronous write start signal for when the DQS begins toggling. In this manner the PDA synchronizer circuit may accommodate both the continuous and legacy mode. When the PDA mode is not active, the PDA synchronizer may pass the write command signal as the synchronized write command signal, bypassing the delay circuit and synchronizer, so as to allow for normal write operations.

FIG. 1 is a block diagram of a semiconductor device according to some embodiments of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. As explained in more detail herein, each bank may be further divided into two or more sub-banks. While embodiments where each bank includes two sub-banks are generally described herein, other embodiments may include more sub-banks per bank.

Each memory sub-bank includes a plurality of word lines WL, a plurality of bit lines BL, and a plurality of memory cells MC arranged at intersections of the plurality of word lines WL and the plurality of bit lines BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. In some embodiments, components such as the row and column decoders and refresh control circuit 116 which are repeated on a per-bank basis may also include components which are repeated on a per-sub-bank basis. For example, there may be a refresh control circuit 116 for each sub-bank.

The bit lines BL are coupled to a respective sense amplifier (SAMP). Read data from the bit line BL is amplified by the sense amplifier SAMP, and transferred to read/write amplifiers 120 over local data lines (LIO), transfer gate (TG), and global data lines (GIO). Conversely, write data outputted from the read/write amplifiers 120 is transferred to the sense amplifier SAMP over the complementary main data lines GIO, the transfer gate TG, and the complementary local data lines LIO, and written in the memory cell MC coupled to the bit line BL.

The semiconductor device 100 may employ a plurality of external terminals, such as solder pads, that include command and address (C/A) terminals coupled to a command and address bus to receive commands and addresses, clock terminals to receive clocks CK and/CK, data terminals DQ coupled to a data bus to provide data, and power supply terminals to receive power supply potentials VDD, VSS, VDDQ, and VSSQ.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The internal data clocks may include a data strobe clock DQS, which is used to time the operation of data latches. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal CS, which may activate a selected one of the sense amplifiers SAMP. The address decoder 104 may also supply a decoded bank address BADD, which may indicate the bank of the memory array 118 containing the decoded row address XADD and column address YADD. The row address XADD may indicate the sub-bank within the bank indicated by BADD.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

During a write operation, the IO circuits 122 may receive the write command and activate input buffers for a period of time after receiving the write command. For example, the IO circuits 122 may activate a data input buffer enable signal for a number of LCKL cycles after receiving the write command. When the data input buffer enable signal is active, data input buffers of the IO circuit 122 are activated, which allows the write data to be received from the DQ terminals.

The data input buffers may then provide the write data along the memory bus to the array 118.

The device 100 may enter a PDA mode, where device specific information is loaded through the DQ terminals, for example to be written to a mode register 132. The memory device 100 may be packaged with other memory devices (not shown) in a module. A PDA mode enable command, such as a multi-purpose command (MPC), may be sent to the memory devices, along with an enumeration ID which identifies the specific device. Responsive to the enumeration ID matching an ID of the device, the device 100 enters a PDA mode, and a PDA enable signal PDA_En is provided at an active level (e.g., at a logical high) by the command decoder along with a write command signal, such as a write start signal. When the PDA_En signal is active, a PDA synchronizer circuit 130 provides a synchronized write start signal responsive to the write start signal. The IO circuits 122 are enabled by the write start signal and receive data with timing based on the DQS clock (e.g., part of LCLK). As part of the PDA mode, the data may then be written to various locations of the memory device 100, such as the mode register 132, for example to set delay values or other device specific settings of the device 100.

During a legacy PDA mode, the device 100 receives the PDA command (e.g., a MPC) and then a fixed time (e.g., a fixed amount of clock cycles CK) later, the DQS clock signal begins toggling. As used here, toggling may refer to the operation of a clock signal. For example, a clock signal which is toggling may alternate between a logical low and a logical high level with fixed timing (e.g., such as a square wave with a set frequency). When the clock signal is not toggling, it may generally remain at a fixed level (e.g., at a logical high or at a logical low).

During the legacy PDA mode, the PDA command, and subsequent signals generated responsive to the PDA command (e.g., a write start signal), may be synchronous to the DQS clock. During a continuous PDA mode, the device 100 receives the PDA command asynchronous to the DQS clock. In either case, the PDA synchronizer provides a synchronous write start signal to the IO circuit 122. When the PDA mode is not active (e.g., when PDA_En is inactive), the PDA synchronizer 130 may pass write signals on to the IO circuit 122 in order to not interfere with normal write operations.

The device 100 includes refresh control circuits 116 each associated with a bank of the memory array 118. Each refresh control circuit 116 may determine when to perform a refresh operation on the associated bank. The refresh control circuit 116 provides a refresh address RXADD (along with one or more refresh signals, not shown in FIG. 1). The row decoder 108 performs a refresh operation on one or more word lines associated with RXADD. The refresh control circuit 116 may perform multiple types of refresh operations, which may determine how the address RXADD is generated, as well as other details such as how many word lines are associated with the address RXADD.

The power supply terminals are supplied with power supply potentials VDD and VSS. The power supply potentials VDD and VSS are supplied to an internal voltage generator circuit 124. The internal voltage generator circuit 124 generates various internal potentials VARY, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
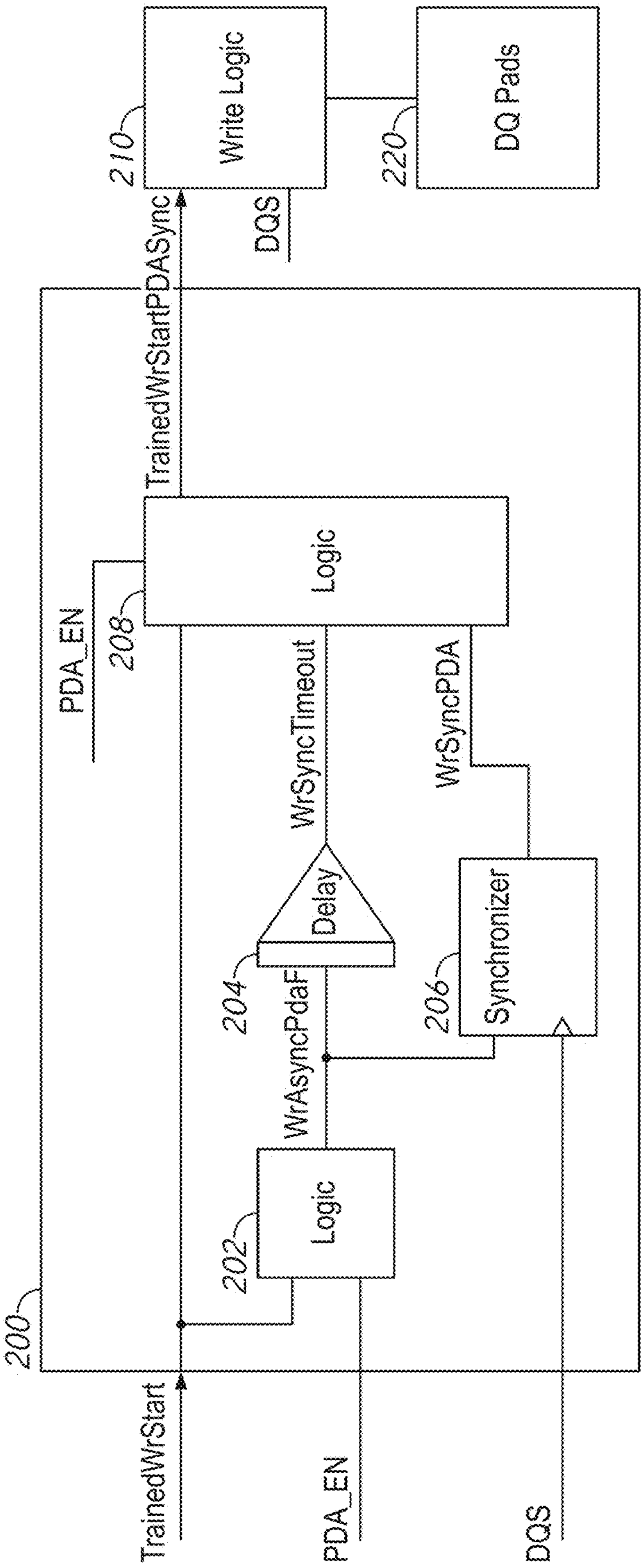
FIG. 2 is a block diagram of a PDA synchronizer circuit according to some embodiments of the present disclosure.

FIG. 2 is a block diagram of a PDA synchronizer circuit according to some embodiments of the present disclosure. The PDA synchronizer 200 may, in some embodiments, implement the PDA synchronizer 130 of FIG. 1.

The PDA synchronizer 200 receives a write start signal TrainedWrStart (e.g., from a command decoder such as 106 of FIG. 1) and provides a synchronized write start signal TrainedWrStartPdaSync to write logic (e.g., write latches) 210, which may be part of an IO circuit such as 122 of FIG. 1. With timing based on a write strobe signal DQS, the write logic 210 receives data from the DQ pads 220. The write logic may begin receiving data with timing based on TrainedWrStartPdaSync.

The PDA synchronizer 200 also receives a PDA enable signal PDA_EN, which is active when the device is in a PDA mode, and inactive otherwise. As part of a PDA mode (e.g., when PDA_EN is active), the synchronizer may receive the write command signal TrainedWrStart either in synchronization with DQS (e.g., with a fixed time relationship to DQS) or asynchronous to DQS (e.g., with no fixed relationship to DQS).

The PDA synchronizer 200 includes a first logic circuit 202 which passes the write start signal TrainedWrStart as a first PDA signal, in this case an asynchronous write start signal WrAsyncPdaF (which in this example embodiment is active low) if the signal PDA_EN is active. If the signal PDA_En is inactive (e.g., the device is not in a PDA mode) then WrAsyncPdaF is not provided. The asynchronous write start signal WrAsyncPdaF is passed to a delay circuit 204 and to a synchronizer circuit 206 in common. The delay circuit 204 provides a timeout signal WrSyncTimeout as a second PDA signal an amount of time after receiving the WrAsyncPdaF signal. The synchronizer circuit 206 synchronizes the asynchronous signal WrAsyncPdaF to the data strobe DQS to provide a synchronous PDA signal WrSyncPda as a third PDA signal.

A logic circuit 208 receives the signals TrainedWrStart, WrSyncTimeout, and WrSyncPda and provides the synchronous write start signal TrainedWrStartPdaSync. If the PDA_EN signal is not active (e.g., the device is not in a PDA mode) then the write start signal TrainedWrStart is passed as the synchronous write start signal TraindWrStartPdaSync. If the PDA enable signal PDA_EN is active, then whichever of the timeout signal WrSyncTimeout or the synchronous PDA signal WrSyncPda arrives at the logic first is provided as the synchronous write start signal TrainedWrStartPdaSync. If the DQS signal is toggling at the time the signal WrAsyncPdaF is provided (e.g., because the device is in a continuous PDA mode) then WrSyncPda will be provided before WrSyncTimeout is provided by the delay circuit. Since the signal WrSyncPda is synchronized to DQS, it may be passed as TrainedWrStartPdaSync. If the DQS signal is not toggling at the time the signal WrAsyncPdaF is provided (e.g., because the device is in a legacy PDA mode), then the signal WrSyncTimeout may be provided before WrSyncPda. In that case, since it may indicate that the device is in the legacy mode, there may already be a fixed relationship between when TrainedWrStart was provided and when the DQS clock begins toggling. Since the delay circuit 204 adds a known amount of time to the process, the relationship may be maintained, and the signal WrSyncTimeout may be synchronous to DQS.

Figure 3:
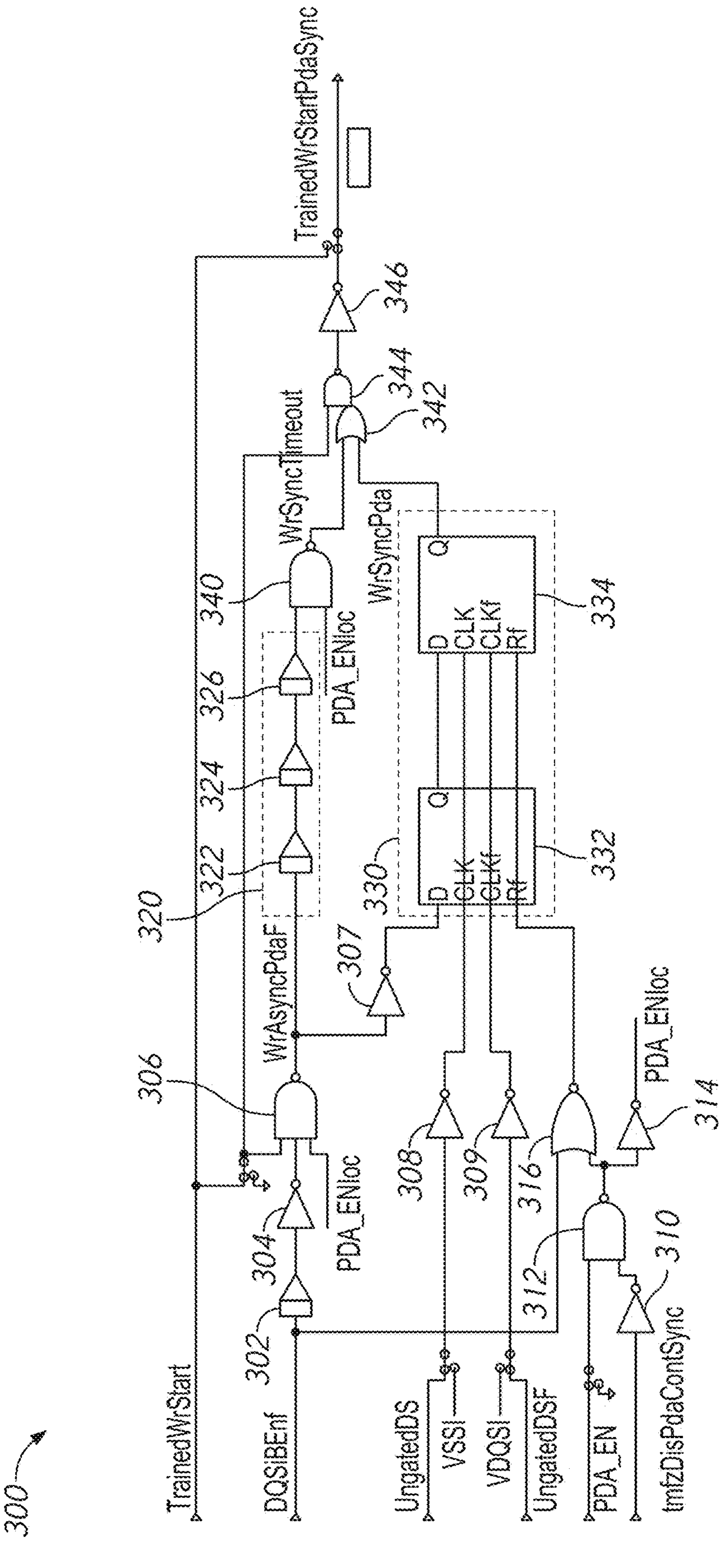
FIG. 3 is a schematic diagram of a PDA synchronizer circuit according to some embodiments of the present disclosure.

FIG. 3 is a schematic diagram of a PDA synchronizer circuit according to some embodiments of the present disclosure. The PDA synchronizer circuit 300 may, in some embodiments, implement the PDA synchronizer 130 of FIGS. 1 and/or 200 of FIG. 2.

The PDA synchronizer circuit 300 receives a write start signal TrainedWrStart, a DQ strobe enable signal DQISBEnF, DQS clock signals UngatedDS and UngatedDSF, as well as a PDA mode enable signal PDA_EN and provide synchronous write start signal TrainedWrStartPdaSync. The PDA synchronizer circuit 300 also receives a fuse setting tmfzDisPdaContSync which may be used to optionally disable the operation of the PDA synchronizer circuit 300. The write start signal TrainedWrStart may be received as part of a normal (non-PDA) write operation, in which case PDA_EN is inactive (e.g., at a low logical level). In that case, TrainedWrStart is passed as the synchronous write start signal TrainedWrStartPdaSync. As part of a PDA mode (e.g., when PDA_EN is active), the PDA synchronizer circuit 300 receives the write start signal TrainedWrStart either synchronous to DQS (e.g., as part of a legacy PDA mode) or asynchronous to DQS (e.g., as part of a continuous PDA mode) and provides the synchronous write start signal TrainedWrStartPdaSync synchronized to DQS (UngatedDS and UngatedDSF).

The PDA synchronizer circuit 300 includes an inverter 310 which receives the fuse signal tmfzDisPdaContSync. The fuse signal tmfzDisPdaContSync may be inactive (e.g., at a low logical level) if a fuse setting of the memory (e.g., stored in a fuse array) indicates that the operation of the PDA synchronizer circuit 300 should be enabled. The inverter 310 has an output coupled to one of the input terminals of a NAND gate 312. The other input terminal of the NAND gate 312 is coupled to the enable signal PDA_EN. Accordingly, an output of the NAND gate 312 is at a logical low if both inputs are high, indicating that the PDA mode is enabled (e.g., PDA_EN is active) and the fuse setting indicates that circuit 300 is not disabled (e.g., tmfzDisPdaContSync is inactive). The output of the NAND gate 312 is inverted by inverter 314 to produce a PDA circuit enable signal PDA_ENloc.

A delay circuit 302 receives the DQS input buffer enable signal DQSIBEnF, which may be an active low signal, which is active when it is at a low logical level. The signal DQSIBEnF may be active to indicate that the input buffers (not shown) which receive DQS should activate. A delay time after DQSIBEnF becomes active, the DQS clock may be passed by DQS clock gating circuits (not shown) as UngatedDS and UngatedDSF. The buffer 302 provides DQSIBEnF to an inverter 304, which provides a signal to an input of a NAND gate 306. The NAND gate 306 also has input terminals coupled to the write start signal TrainedWrStart and the PDA circuit enable signal PDA_Enloc. The NAND gate 306 provides an asynchronous PDA signal WrAsyncPdaF, which may be active low, and thus may be at a low logical level only when all three of TrainedWrStart, PDA_Enloc, and DQSIBEnF are active. The signal WrAsyncPdaF may be either synchronous or asynchronous depending on the PDA mode, and so since its synchronicity may not be assumed, it is listed as an asynchronous signal. Accordingly, when the PDA mode is active (and the circuit is not disabled by the fuse setting), and when the DQS input buffers are active, when TrainedWrStart becomes active, the signal WrAsyncPdaF will become active by falling to a low logical level.

The PDA synchronizer circuit 300 includes a delay path 320 (e.g., delay circuit 204 of FIG. 2) which receives asynchronous signal WrAsyncPdaF as an input and provides it as an output a delay time later. In the embodiment of FIG. 3, the delay path 320 includes three delay circuits 322-326 (e.g., buffers) in series with each other. However, other example embodiments may use other types of delay. The delay path 320 provides the asynchronous signal WrAsyncPdaF to the input of NAND gate 340, which has a second input terminal coupled to PDA circuit enable signal PDA_ENloc. The NAND gate 340 provides a timeout signal WrSyncTimeout. When both WrAsyncPdaF provided by the delay path 320 and PDA_ENloc are high, then WrSyncTimout may be a low logical level. For example, when the PDA mode is enabled but before the signal TrainedWrStart is active. When activation of WrAsyncPdaf (e.g., WrAsyncPdaF falling to a low logical level) passes through the delay path 320, the timeout signal WrSyncTimeout may become a high logical level. The PDA mode being inactive (e.g., PDA_ENloc being inactive) may also cause the timeout signal WrSyncTimeout be at an active level.

The PDA synchronizer circuit 300 also includes a synchronizer circuit 330 (e.g., 206 of FIG. 2). The synchronizer circuit 300 includes a first latch 332 and a second latch 334 in series. While two latches are used in the embodiment of FIG. 3, other numbers of latches and other methods of synchronizing may be used in other example embodiments. The asynchronous signal WrAsyncPdaF is passed through an inverter 307 to form a signal which is complimentary to WrAsyncPdaF and is therefore active high (e.g., active at a high logical level). The asynchronous active high signal is passed to an input terminal D of the first latch 332. The first latch 332 has an output terminal Q coupled to an input terminal D of the second latch 334. The second latch 334 has an output terminal Q which provides the synchronized PDA signal WrSyncPda. Both latches 332 and 334 with clock terminals CLK and CLKf coupled through respective buffers 308 and 309 to the ungated DQS signals UngatedDS and UngatedDSF respectively. A NOR gate 316 receives the signals DQSIBEnF and the output of NAND gate 312 (e.g., the inverse of PDA_ENloc) and provides a signal to the reset terminals Rf of the two latches 332 and 334. Accordingly, only when the inputs DQSIBEnF is low and PDA_ENloc is high (e.g., and its inverse is low) will the reset terminals receive a logical high signal and not be reset. Accordingly, when WrAsyncPdaF becomes active low, a logical high will pass through the synchronizer 330 in synch with UngatedDS and UngatedDSF and the signal WrSyncPda will become active in sync with UngatedDS and UngatedDSF. If the PDA mode is not enabled or if the DQS input buffers are not enabled (e.g., and DQSIBEnF is high), then the latches 332-334 will be reset and WrSyncPda will remain low.

The timeout signal WrSyncTimeout and the synchronized PDA signal WrSyncPda are passed as inputs to an OR gate 342. The output of the OR gate 342 is coupled to an input of NAND gate 344. The other input of the NAND gate 344 is TrainedWrStart. The output of the NAND gate 344 is passed through an inverter 346 to become the signal TrainedWrStartPdaSync. Accordingly, in a PDA mode, whichever of WrSyncTimeout and WrSyncPda arrives first will cause the output of the NAND gate 344 to fall to a low logical level (e.g., since TrainedWrStart will already be high) which in turn will cause TrainedWrStartPdaSync to become high. In other words, during a PDA mode, when TrainedWrStartPdaSync becomes active may be determined by a race between WrSyncTimeout and WrSyncPda. In a continuous mode, where UngatedDS and UngatedDSF are provided asynchronous to TrainedWrStart, then the signal WrSyncPda may arrive before WrSyncTimeout as WrAsyncPdaF passes through the synchronizer 330. In a legacy mode, where UngatedDS and UngatedDSF begin toggling at a later time, then the signal WrSyncTimeout may exit the delay path 320 first. If the device is not in a PDA mode, then the signal WrSyncTimeout may be forced high (e.g., by the NAND gate 340 in response to PDA_ENloc being low), which in turn means that as soon as TrainedWrStart becomes active, it is passed by the NAND gate 344 and TrainedWrStartPdaSync will become active responsive to TrainedWrStart.

Figure 4:
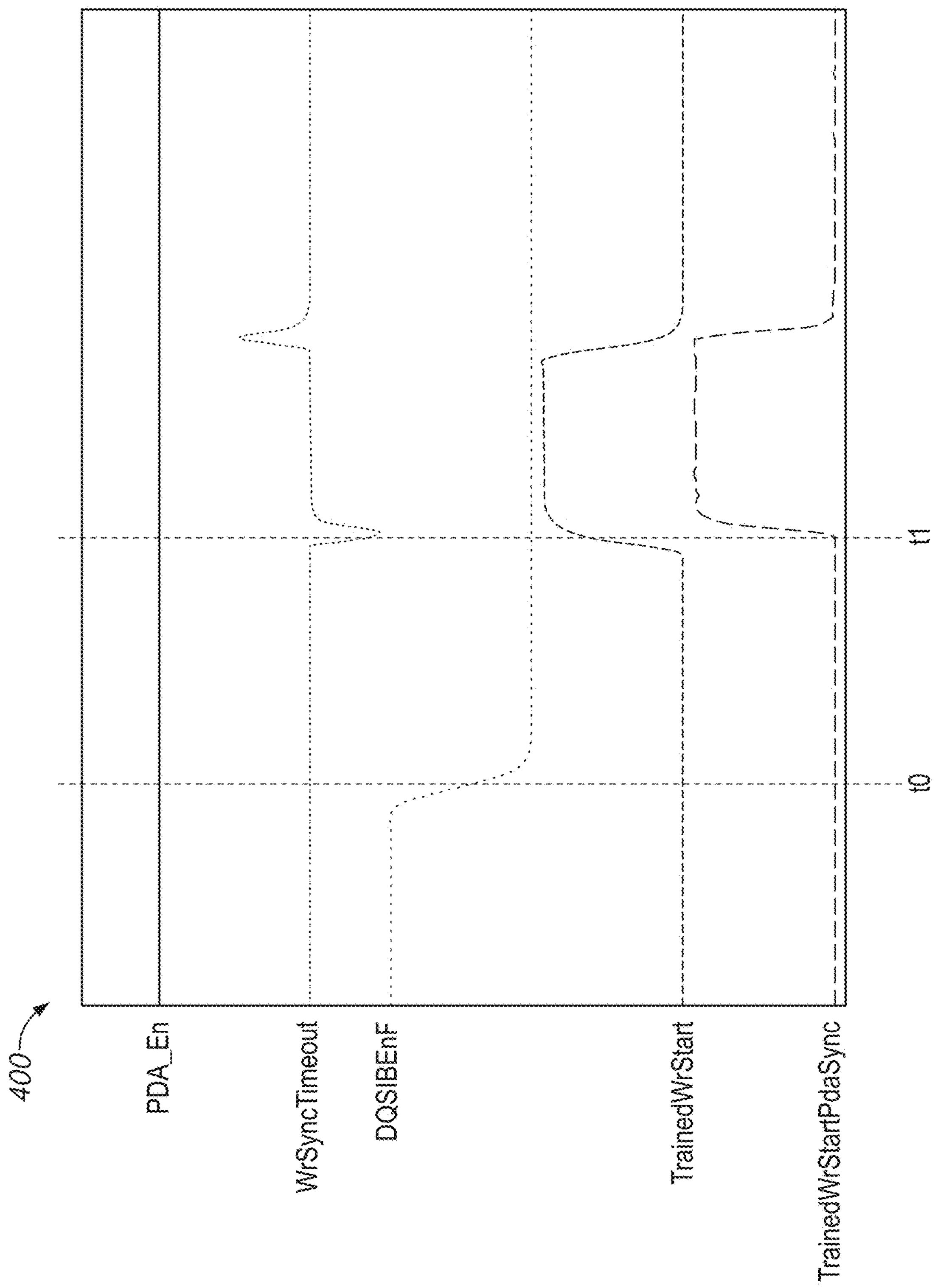
FIG. 4 is a timing diagram of a write operation according to some embodiments of the present disclosure.

FIG. 4 is a timing diagram of a write operation according to some embodiments of the present disclosure. The timing diagram 400 may, in some embodiments, represent the operation of one or more of the apparatuses and/or systems described in FIGS. 1-3. In particular, for illustrative purposes, the timing diagram 400 may be described with respect to signal names and components of the PDA synchronizer circuit 300 of FIG. 3. The timing diagram 400 represents the operation of the PDA synchronizer circuit during a normal write operation (e.g., when a PDA mode is not enabled).

Since the operation of the timing chart 400 represents an operation where a PDA mode is not enabled, the PDA_EN signal may remain inactive (e.g., at a low logical level) throughout. Because PDA_EN is at a low logical level, the timeout signal WrSyncTimeout may be forced to a high logical level (e.g., due to NAND gate 340 of FIG. 3) throughout. At an initial time t0, the DQS input buffer enable signal DQSIBEnF becomes active (e.g., by falling to a low logical level).

At a first time t1, the write start signal TrainedWrStart becomes active (e.g., by rising to a logical high level). Since the signal WrSyncTimeout is active (due to PDA_En being inactive), the signal TrainedWrStart may be passed as TrainedWrStartPdaSync. This in turn, may enable the write path to accept data as part of the write operation.

Figure 5:
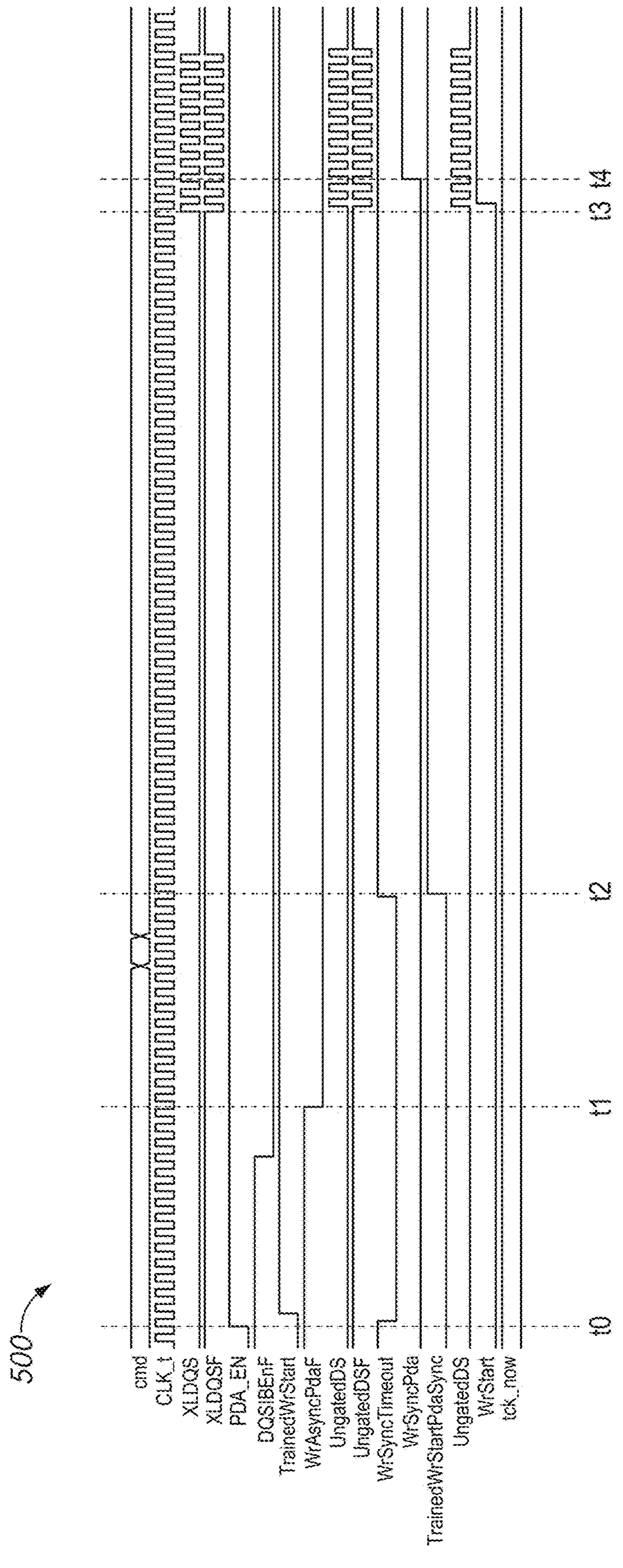
FIG. 5 is a timing diagram of a PDA legacy mode according to some embodiments of the present disclosure.

FIG. 5 is a timing diagram of a PDA legacy mode according to some embodiments of the present disclosure. The timing diagram 500 may, in some embodiments, represent the operation of one or more of the apparatuses and/or systems described in FIGS. 1-3. In particular, for illustrative purposes, the timing diagram 500 may be described with respect to signal names and components of the PDA synchronizer circuit 300 of FIG. 3. The timing diagram 500 represents the operation of the PDA synchronizer circuit during a legacy PDA mode, where a PDA command is received and then an amount of time later the DQS clocks begin toggling. In the view of FIG. 5, the time the PDA command is received is not shown (e.g., it is before the initial time to).

At an initial time to, the PDA enable signal PDA_EN becomes active (e.g., rises to a high logical level) responsive to the PDA command received before to. Responsive to the signal PDA_EN becoming active, the timeout signal WrSyncTimeout becomes inactive (e.g., falls to a low logical level). At around the time to, the write start signal TrainedWrStart also becomes active, responsive to the PDA command received before t0. Between to and a first time t1, the DQS input buffer signal becomes active, by falling to a logical low. Accordingly, at the time t1, the asynchronous signal WrAsyncPdaF becomes active by falling to a logical low (e.g., since PDA_EN, TrainedWrStart, and DQSIBEnF are all active). The change in the state of WrAsyncPdaF begins propagating through the delay circuit (e.g., 320 of FIG. 3). At a time t2, which is after t1, the timeout signal WrSyncTimeout becomes active (e.g., rises to a high logical level) responsive to the signal WrAsyncPdaF passing through the delay circuit. This, in turn, causes TrainedWrStartPdaSync to become active (e.g., rise to a logical high) as well.

At a third time t3, the DQS clock, XLDQS and XLDQSF begin toggling. The time between the PDA command being received and t3 may be a known amount of time. Since the DQSIBEnF signal is active, a short time after t3, the ungated DQS signals UngatedDS and Ungated DSF also begin toggling. Since the ungated DQS signals are toggling, an overall write start signal WrStart becomes active responsive to TrainedWrStartPdaSync being active. WrStart may activate in sync with the ungated DQS signals. The signal WrStart becoming active may, in turn activate various components of the write path. At a fourth time t4, the signal WrSyncPda becomes active, now that the synchronizer is operated by the ungated DQ signals. However, since WrSyncTimeout was already active, this may not affect the other signals.

Figure 6:
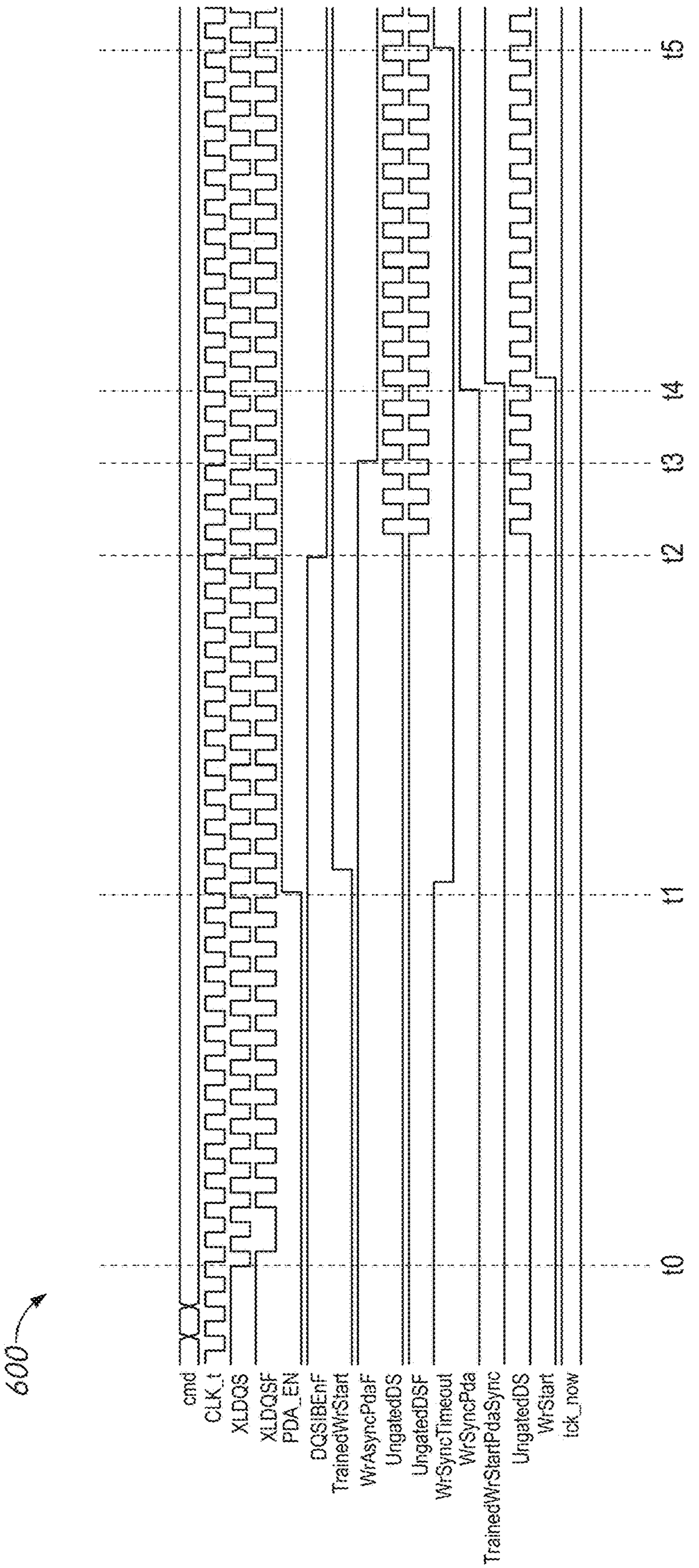
FIG. 6 is a timing diagram of a PDA continuous mode according to some embodiments of the present disclosure.

FIG. 6 is a timing diagram of a PDA continuous mode according to some embodiments of the present disclosure. The timing diagram 600 may, in some embodiments, represent the operation of one or more of the apparatuses and/or systems described in FIGS. 1-3. In particular, for illustrative purposes, the timing diagram 600 may be described with respect to signal names and components of the PDA synchronizer circuit 300 of FIG. 3. The timing diagram 600 represents the operation of the PDA synchronizer circuit during a continuous PDA mode, where the DQS clocking has an asynchronous relationship to the PDA command (e.g., the DQS clocks begin toggling before the PDA command is received).

At an initial time t0, the DQS clock begins toggling. There may not be a fixed relationship between when the PDA command is received and when the DQS clock begins toggling in the continuous mode. At a first time t1, the PDA mode enable signal PDA_EN becomes active (e.g., rises to a high level) responsive to the PDA command. Shortly after the time t1, the signal WrSyncTimeout falls to a low level responsive to PDA_EN becoming active. Shortly after the time t1, the write start signal TrainedWrStart becomes active, also responsive to the PDA command. At a time t2, the DQS input buffer enable signal DQSIBEnF becomes active (e.g., at a low logical level). Shortly after t2, this causes the ungated DQS signals be begin toggling.

At a time t3, the signal WrAsyncPdaF becomes active (e.g., at a low logical level) because the signals DQISBenF, TrainedWrStart, and PDA_En are all active. At a time t4, the toggling of the gated DQS signals causes the inverse of the signal WrAsyncPdaF to pass through the synchronizer (e.g., 330 of FIG. 3) which causes the signal WSyncPDA to become active. The signal WSyncPDA becoming active in turn causes TrainedWrStartPdaSync to become active (since the timeout signal WrSyncTimeout is still low). This in turn causes the overall write start signal WrStart to become active. At a time t5, the timeout signal WrSyncTimeout becomes active, however, since the timeout signal had already become active, the signal WrStart has already become active before t5.

Figure 7:
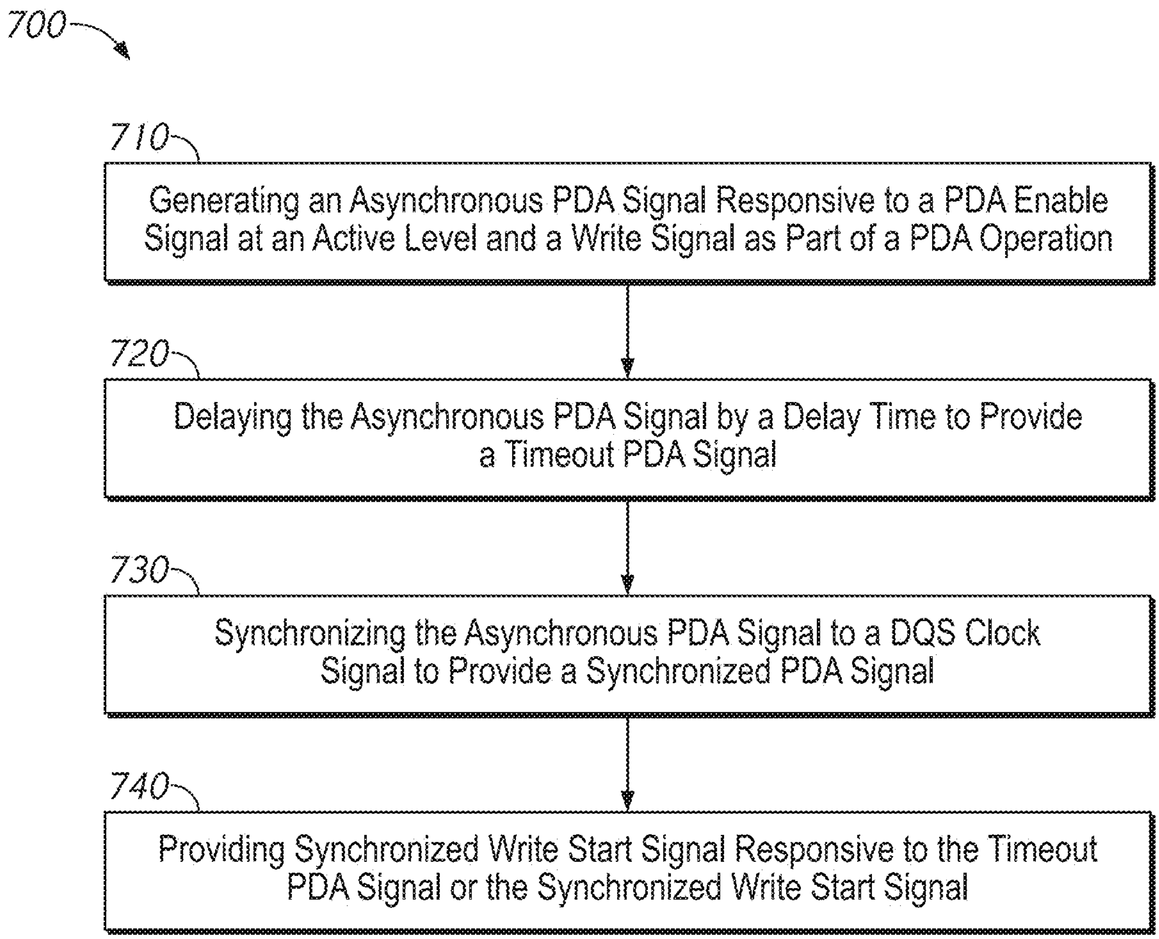
FIG. 7 is a flow chart of a method according to some embodiments of the present disclosure.

FIG. 7 is a flow chart of a method according to some embodiments of the present disclosure. The method 700 may, in some embodiments, be implemented by one or more of the apparatuses or systems described herein. For example, the method 700 may be implemented by the PDA synchronizer circuit 130 of FIG. 1, 200 of FIG. 2, and/or 300 of FIG. 3.

The method 700 may generally begin with block 710, which describes generating an asynchronous per DRAM addressability (PDA) signal (e.g., WrAsyncPdaF of FIG. 2 or 3) responsive to a PDA enable signal at an active level and a write start signal as part of a PDA operation. For example, the asynchronous PDA signal may be generated responsive to the write start signal when the PDA enable signal is active and when a fuse setting of the device does not disable the PDA synchronizer circuit.

The method 700 may include receiving a PDA command (e.g., a multi-purpose command) to begin a PDA mode. The method 700 may include providing the PDA enable signal at the active level and providing the write start signal (e.g., from a command decoder) responsive to the PDA command. The method 700 may include receiving the write start signal (and the PDA command) synchronous to the DQS clock as part of a first mode (e.g., as part of a legacy PDA mode). The method 700 may include receiving the write start signal (and the PDA command) asynchronous to the DQS clock as part of a second mode (e.g., as part of a continuous PDA mode).

Block 710 may generally be followed by block 720, which describes delaying the asynchronous PDA signal by a delay time to provide a timeout PDA signal. For example, a delay circuit (e.g., 204 of FIG. 2) may provide the timeout signal (e.g., WrSyncTimeout) a delay time after receiving the asynchronous PDA signal.

The method includes block 730, which describes synchronizing the asynchronous PDA signal to a DQS clock signal to provide a synchronized PDA signal. The operations of blocks 720 and 730 may generally be performed in parallel with each other. For example, a synchronizer circuit (e.g., 206 of FIG. 2) may provide the synchronized PDA signal (e.g., WrSyncPDA) synchronized to the DQS clock signal when the DQS clock signal is toggling.

Block 730 may generally be followed by block 740, which describes providing a synchronized write start signal responsive to the timeout PDA signal or the synchronized write start signal. For example the method 700 may include providing the synchronized write start signal responsive to whichever of the timeout PDA signal or the synchronized write start signal is provided first. The method 700 may include providing the timeout PDA signal before the synchronized PDA signal as part of the first mode. The method 700 may include providing the synchronized PDA signal before providing the timeout PDA signal as part of the second mode.

The method 700 may include receiving the PDA enable signal at an inactive level and the write start signal as part of a write operation, and providing the write start signal as the synchronized write start signal when the PDA enable signal is inactive. For example, the method 700 may include providing the timeout PDA signal responsive to the PDA enable signal at the inactive level. The method 700 may include enabling data latches (e.g., part of write logic 210 of FIG. 2) based, in part on the synchronized write start signal and receiving data at the data latches with timing based on the DQS clock signal.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:

a command decoder configured to provide a write command signal synchronous to a DQS clock as part of a first PDA mode and to provide the write command signal asynchronous to the DQS clock as part of a second PDA mode;

a per DRAM addressability (PDA) synchronizer circuit configured to provide a synchronized write command signal a delay time after receiving the write command signal as part of the first PDA mode, and configured to provide the synchronized write command signal based on synchronizing the write command signal to the DQS clock as part of the second PDA mode.

2. The apparatus of claim 1, wherein the PDA synchronizer circuit comprises:

a delay circuit configured to receive the write command signal and provide a first PDA signal a delay time later;

a synchronizer circuit configured to receive the write command signal and provide a second PDA signal based on synchronizing the write command signal to the DQS clock; and a logic circuit configured to receive the first PDA signal and the second PDA signal and provide the synchronized write command signal responsive to whichever of the first PDA signal or the second PDA signal is received first.

3. The apparatus of claim 2, wherein the first PDA signal is provided before the second PDA signal as part of the first mode, and wherein the second PDA signal is provided before the first PDA signal as part of the second mode.

4. The apparatus of claim 1, wherein the command decoder is configured to provide the write command signal and a PDA enable mode signal at an inactive level as part of a write operation, wherein the PDA synchronizer circuit is configured to provide the write command signal as the synchronized write command signal responsive to the PDA enable mode at the inactive level.

5. The apparatus of claim 1, further comprising a write path configured to be enabled responsive to the synchronized write command signal, wherein the write path is configured to receive data with timing based on the DQS clock signal when enabled.

6. The apparatus of claim 1, wherein the PDA synchronizer circuit is configured to be disabled by a fuse setting.

7. The apparatus of claim 1, wherein the first PDA mode is a legacy PDA mode and the second PDA mode is a continuous PDA mode.

8. A method comprising:

providing a write command signal synchronous to a DQS clock as part of a first per-DRAM addressability (PDA) mode or providing a write command signal asynchronous to the DQS clock as part of a second PDA mode;

generating a synchronized write command signal by delaying the write command signal when the device is in the first PDA mode;

generating the synchronized write command signal by synchronizing the write command signal to the DQS clock when the device is in the second PDA mode; and providing the synchronized write command signal.

9. The method of claim 8, further comprising:

enabling a write path responsive to the synchronized write command signal; and receiving data with timing based on the DQS clock when the write path is enabled.

10. The method of claim 8, further comprising loading a setting into a mode register based on the received data.

11. The method of claim 8, further comprising:

generating a first PDA signal by delaying the write command signal by a delay time with a delay circuit;

generating a second PDA signal by synchronizing the write command signal to the DQS clock with a synchronizer circuit;

receiving the first PDA and the second PDA signal at a logic circuit and determining if the first or the second PDA signal was received first; and providing the first PDA signal or the second PDA signal as the synchronized write command signal responsive to whichever of the first PDA signal or the second PDA signal was received by the logic circuit first.

12. The method of claim 11, further comprising receiving the first PDA signal before the second PDA signal in the first PDA mode.

13. The method of claim 11, further comprising receiving the second PDA signal before the first PDA signal in the second PDA mode.

14. The method of claim 8, further comprising:

receiving a PDA enable signal and an enumeration ID;

matching the enumeration ID to an ID of the device; and entering the first PDA mode or the second PDA mode responsive to the PDA enable signal when the enumeration IDS matches the ID of the device.

15. An apparatus comprising:

a per-DRAM addressability (PDA) synchronizer circuit configured to receive a write command synchronized to a DQS signal in a first PDA mode or to receive the write command asynchronous to the DQS signal in a second PDA mode and to provide a synchronized write command signal which is synchronized to the DQS signal in either the first or the second PDA mode; and a data latch configured to be enabled by the synchronized write command signal from the PDA synchronizer circuit, wherein the data latch is configured to receive data when enabled.

16. The apparatus of claim 15, wherein the PDA synchronizer circuit is configured to receive the write command and to provide the synchronized write command signal when a PDA enable signal is active.

17. The apparatus of claim 15, wherein the synchronizer circuit comprises:

a delay circuit configured to provide a first PDA signal a delay time after receiving the write command;

a synchronizer circuit configured to provide a second PDA signal based on synchronizing the write command to the DQS signal;

a logic circuit configured to provide the first PDA signal as the synchronized write command signal in the first PDA mode or the second PDA signal as the synchronized write command signal in the second PDA mode.

18. The apparatus of claim 15, further comprising a mode register, wherein the data received by the data latch is written to the mode register as part of the first PDA mode or the second PDA mode.

19. The apparatus of claim 15, further comprising a command decoder configured to receive a PDA command and provide the write command responsive to the PDA command.

20. The apparatus of claim 15, wherein the command decoder is configured to receive a multi-purpose command as the PDA command.

* * * * *